US011094498B2

(12) United States Patent
Mukai

(10) Patent No.: US 11,094,498 B2
(45) Date of Patent: Aug. 17, 2021

(54) MONOCHROMATOR AND CHARGED PARTICLE BEAM SYSTEM

(71) Applicant: JEOL Ltd., Tokyo (JP)

(72) Inventor: Masaki Mukai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/910,270

(22) Filed: Jun. 24, 2020

(65) Prior Publication Data

US 2020/0411273 A1 Dec. 31, 2020

(30) Foreign Application Priority Data

Jun. 25, 2019 (JP) .............................. JP2019-116967

(51) Int. Cl.
*H01J 37/05* (2006.01)
*H01J 37/28* (2006.01)

(52) U.S. Cl.
CPC .............. *H01J 37/05* (2013.01); *H01J 37/28* (2013.01); *H01J 2237/057* (2013.01)

(58) Field of Classification Search
CPC ....... H01J 37/05; H01J 37/28; H01J 2237/057
USPC ...... 250/305, 306, 310, 311, 396 R, 396 ML
See application file for complete search history.

(56) References Cited

U.S. PATENT DOCUMENTS

| 6,580,073 | B2 * | 6/2003 | Plies ..................... H01J 49/288 |
| | | | 250/305 |
| 10,622,183 | B2 * | 4/2020 | Ogawa .................... H01J 37/05 |
| 2001/0052744 | A1 | 12/2001 | Tsuno | |
| 2013/0248699 | A1 * | 9/2013 | Mukai ................... H01J 37/023 |
| | | | 250/252.1 |
| 2018/0114672 | A1 * | 4/2018 | Ogawa ................... H01J 37/05 |

FOREIGN PATENT DOCUMENTS

JP 2001357809 A 12/2001

* cited by examiner

*Primary Examiner* — Michael Maskell
(74) *Attorney, Agent, or Firm* — The Webb Law Firm

(57) ABSTRACT

There is provided a monochromator capable of reducing angular dispersion in electron rays. In the monochromator, a first Wien filter and a second Wien filter are arranged symmetrically with respect to a first plane of symmetry. A third Wien filter and a fourth Wien filter are arranged symmetrically with respect to a second plane of symmetry. A pair of the first and second Wien filters and a pair of the third and fourth Wien filters are arranged symmetrically with respect to a third plane of symmetry. The first through fourth Wien filters produce their respective electromagnetic fields which are identical in sense and strength.

4 Claims, 4 Drawing Sheets

MONOCHROMATOR AND CHARGED PARTICLE BEAM SYSTEM

CROSS-REFERENCE TO RELATED APPLICATION

This application claims priority to Japanese Patent Application No. 2019-116967, filed Jun. 25, 2019, the disclosure of which is hereby incorporated by reference in its entirety.

BACKGROUND OF THE INVENTION

1. Field of the Invention

The present invention relates to a monochromator and a charged particle beam system.

2. Description of the Related Art

Monochromators are used to achieve higher resolution in electron energy loss spectroscopy (EELS) implemented in transmission electron microscopy (TEM). In a transmission electron microscope, the maximum amount of information achievable by a transmission electron microscope (TEM) image can be improved by monochromatizing the electron rays by means of a monochromator. Also, the morphology of a substance can be imaged and observed at atomic resolution. In scanning transmission electron microscopy (STEM), electronic states of an atomic-scale, microscopic area of a substance can be analyzed by the use of both high-angle annular dark field scanning transmission electron microscopy (HAADF-STEM) and EELS to achieve both atomic-scale spatial resolution and high energy resolution at the same time using a monochromator and an aberration corrector on the illumination side.

Monochromators of the single Wien filter type and monochromators of the double Wien filter type are known (see, for example, JP-A-2001-357809).

With the single Wien filter type, a spectrum is created at the crossover point of the electron rays emerging from the Wien filter. An energy-selecting slit is placed at a plane that is conjugate to the spectrum. The electron rays passed through the energy-selecting slit have an finite energy width corresponding to the slit width. Therefore, the electron source of the electron rays passed through the monochromator has a shape stretched in the direction of energy dispersion. Consequently, in high-resolution STEM imaging, spatial resolution exhibits anisotropy. Also, in high-resolution TEM imaging, a virtual electron source for the electron rays directed at a sample is not circular in shape but is stretched in a given direction. Hence, interference of electron rays has anisotropy.

In this way, in the single Wien filter type, energy dispersion remains. On the other hand, in the double Wien filter type, energy dispersion can be canceled out at the focal point of the electron rays passed through the monochromator.

FIG. 4 shows the configuration of a monochromator, 2, of the double Wien filter type. In FIG. 4, trajectories of electron rays with different energies are indicated by solid and broken lines.

The monochromator 2 has a Wien filter 5, an energy-selecting slit 6, and another Wien filter 7. An electrostatic lens 4 is positioned at the entrance of the monochromator 2, while another electrostatic lens 8 is located at the exit of the monochromator 2.

Rays of an electron beam emitted from an electron source 3 are collimated by the electrostatic lens 4 and spectrally dispersed by the Wien filter 5. As a result, a spectrum corresponding to the velocity distribution in the electron beam is created on the energy-selecting slit 6. This slit 6 passes the electron rays which are uniform in velocity. Consequently, the electron rays are monochromatized. The electron rays passed through the energy-selecting slit 6 have a finite energy width corresponding to the width of the slit 6.

The electron rays passed through the energy-selecting slit 6 are collimated by the Wien filter 7 and converged into one point by the electrostatic lens 8. Consequently, energy dispersion is canceled out. The rays are achromatized at the focal plane. The virtual electron source for the achromatized electron rays at the focal plane is circular in shape.

It is possible to form STEM images having high, isotropic spatial resolution by using a circular virtual electron source and focusing monochromatized electron rays onto a sample in this way. This allows for analysis, for example, using both HAADF-STEM and EELS in which both high spatial resolution and high energy resolution are achieved at the same time.

Where a TEM image is generated by irradiating a wide area of a sample with an electron beam, the electron beam interference is made isotropic by the circular virtual electron source. Furthermore, the effects of chromatic aberration are reduced by the monochromatization of the electron beam. This allows for, for example, generation of TEM images having higher resolution.

In the monochromator 2 of the double Wien filter type, energy dispersion is canceled out at the focal plane for the electron rays passed through the monochromator as noted above. However, energy dispersion occurs before and after the focal plane because angular dispersion occurs in the electron rays exiting from the monochromator 2.

In particular, in the monochromator 2, different energies of the electron rays cause the angles of the electron rays relative to the optical axis to be nonuniform. In the example shown in FIG. 4, the electron rays of different energies are converged into one point by the electrostatic lens 8 but the trajectories from the electrostatic lens 8 to the focal plane form nonuniform angles relative to the optical axis. Consequently, angular dispersion occurs.

As also shown in FIG. 4, in an angular region A1 close to the optical axis, electron rays having different energies overlap each other and so the electron beam energy is uniform. However, in angular regions A2 remote from the optical axis in the direction of energy dispersion, electron rays having different energies do not overlap and thus the electron beam energy is not uniform. Therefore, energy dispersion occurs before and after the focal plane for the electron rays passed through the monochromator. Accordingly, in a case where a defocused electron beam is made to impinge on a sample, for example, the electron beam does not have uniform energy in the angular regions A2. In consequence, a TEM image generated from the electron rays in the angular regions A2 is blurred.

In this way, in the double Wien filter type monochromator, the electron rays passed through the monochromator experience angular dispersion and, therefore, there is a need for a monochromator capable of reducing angular dispersion.

SUMMARY OF THE INVENTION (1) One aspect of the monochromator associated with the present invention has: a first Wien filter; a second Wien filter placed behind (i.e., downstream of) the first Wien filter; a third Wien filter placed behind the second Wien filter; a fourth Wien filter placed behind the third Wien filter; and at least one energy-selecting slit placed in at least one of a space between the first and second Wien filters and a space between the third and fourth Wien filters. The first and second Wien filters are arranged symmetrically with respect to a first plane of symmetry. The third and fourth Wien filters are arranged symmetrically with respect to a second plane of symmetry. A pair of the first and second Wien filters and a pair of the third and fourth Wien filters are arranged symmetrically with respect to a third plane of symmetry. The first, second, third, and fourth Wien filters produce their respective electromagnetic fields which are identical in sense and strength.

In this monochromator, positional dispersion and angular dispersion of the electron rays can be reduced by the use of the four stages of Wien filters.

(2) One aspect of the charged particle beam system associated with the present invention includes the monochromator as defined in (1) above.

DETAILED DESCRIPTION OF THE INVENTION

The preferred embodiments of the present invention are hereinafter described in detail with reference to the drawings. It is to be understood that the embodiments described below are not intended to unduly restrict the content of the present invention delineated by the claims and that not all the configurations described below are essential constituent components of the invention.

1. First Embodiment 1.1. Configuration of Monochromator

Figure 1:
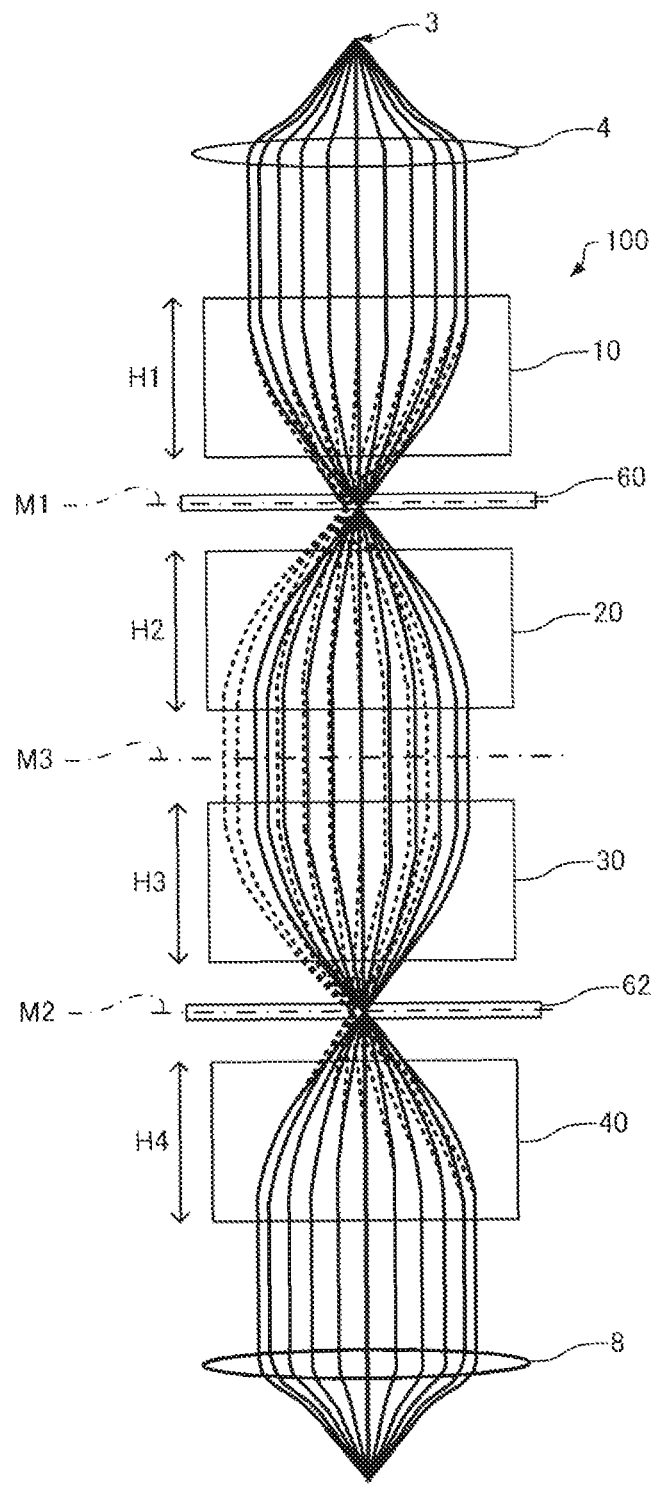
FIG. 1 is an electron ray diagram illustrating the configuration of a monochromator associated with a first embodiment of the present invention.

A monochromator associated with a first embodiment is first described by referring to FIG. 1, which shows the configuration of the monochromator, 100, associated with the first embodiment. In FIG. 1, trajectories of electron rays having different energies are indicated by solid and broken lines.

As shown in FIG. 1, the monochromator 100 includes a first Wien filter 10, a second Wien filter 20, a third Wien filter 30, a fourth Wien filter 40, a first energy-selecting slit 60, and a second energy-selecting slit 62. In this way, the monochromator 100 is equipped with four stages of Wien filters. The monochromator 100 is positioned between a first electrostatic lens 4 and a second electrostatic lens 8.

The second Wien filter 20 is located behind (i.e., downstream of) the first Wien filter 10. The third Wien filter 30 is disposed behind the second Wien filter 20. The fourth Wien filter 40 is positioned behind the third Wien filter 30. That is, the first, second, third, and fourth filters 10, 20, 30, and 40, respectively, are arranged in turn in this order from the electron source (3) side.

The first Wien filter 10 uses electric and magnetic fields which intersect perpendicularly to each other. The first Wien filter 10 produces an electromagnetic field in an electron beam path. Specifically, the first Wien filter 10 applies the mutually perpendicularly intersecting electric and magnetic fields to the path of the electron beam traveling along the optical path. Each of the second Wien filter 20, third Wien filter 30, and fourth Wien filter 40 is a filter using mutually perpendicular electric and magnetic fields in the same way as the first Wien filter 10, and produces an electromagnetic field within the electron beam path.

All of the first Wien filter 10, second Wien filter 20, third Wien filter 30, and fourth Wien filter 40 produce the same electromagnetic field. That is, the electromagnetic fields produced by the first through fourth Wien filters 10, 20, 30, 40, respectively, are identical in strength and sense. That electromagnetic fields are identical in strength means that their electric fields are identical in strength and their magnetic fields are identical in strength. Also, that electromagnetic fields are identical in sense means that their electric fields are identical in sense and their magnetic fields are identical in sense.

The first Wien filter 10, second Wien filter 20, third Wien filter 30, and fourth Wien filter 40 have heights H1, H2, H3, and H4, respectively, which are all equal to each other. That is, $H1:H2:H3:H4=1:1:1:1$. The height of a Wien filter can also be referred to as the filter length.

The first Wien filter 10 and the second Wien filter 20 are arranged symmetrically with respect to a first plane of symmetry M1. The third Wien filter 30 and the fourth Wien filter 40 are arranged symmetrically with respect to a second plane of symmetry M2. The distance between the first Wien filter 10 and the second Wien filter 20 is equal to the distance between the third Wien filter 30 and the fourth Wien filter 40.

A pair of the first filter 10 and second filter 20 and a pair of the third filter 30 and fourth filter 40 are arranged symmetrically with respect to a third plane of symmetry M3. The distance between the second Wien filter 20 and the third plane of symmetry M3 is equal to the distance between the third plane of symmetry M3 and the third Wien filter 30.

The first energy-selecting slit 60 is disposed between the first Wien filter 10 and the second Wien filter 20 and placed in the first plane of symmetry M1. The first energy-selecting slit 60 has a finite width.

The second energy-selecting slit 62 is disposed between the third Wien filter 30 and the fourth Wien filter 40 and positioned in the second plane of symmetry M2. The second energy-selecting slit 62 has a finite width.

The first electrostatic lens 4 is mounted at the entrance of the monochromator 100 and located ahead of the first Wien filter 10. The first electrostatic lens 4 operates to collimate the electron rays emitted from the electron source 3. That is, the electron rays emanating from the electron source 3 are collimated by the action of the first electrostatic lens 4.

The second electrostatic lens 8 is mounted at the exit of the monochromator 100 and located behind the fourth Wien filter 40. The second electrostatic lens 8 operates to converge the electron rays passed through the fourth Wien filter 40.

1.2. Operation of Monochromator

The operation of the monochromator 100 is next described by referring to the electron ray diagram of FIG. 1.

In the monochromator 100, the first through fourth Wien filters 10, 20, 30, 40 are operated such that the same electromagnetic field is produced by these Wien filters 10, 20, 30, 40.

The electron rays emitted from the electron source 3 are collimated by the first electrostatic lens 4 and spectrally dispersed by the first Wien filter 10. As a result, a spectrum corresponding to the velocity distribution among the electron rays is created on the first energy-selecting slit 60. The electron rays which have been made uniform in velocity are passed through the first energy-selecting slit 60. Consequently, the electron rays are monochromatized. The electron rays emerging from the slit 60 have a finite energy width corresponding to the width of the first energy-selecting slit 60.

The electron rays passed through the first energy-selecting slit 60 are collimated by the second Wien filter 20 and spectrally dispersed by the third Wien filter 30. As a result, a spectrum corresponding to the distribution of velocity among the electron rays is formed on the second energy-selecting slit 62. The electron rays passed through the slit 62 enter the fourth Wien filter 40.

In the fourth Wien filter 40, the electron rays are collimated. Also, positional dispersion and angular dispersion are canceled out. As shown in FIG. 1, the trajectories of the electron rays having different energies agree in the fourth Wien filter 40, whereby the positional dispersion and angular dispersion are canceled out.

The electron rays passed through the fourth Wien filter 40 are converged into one point by the second electrostatic lens 8. In the monochromator 100, positional dispersion and angular dispersion of the electron rays are canceled out and, therefore, the energy dispersion is nullified at and around the focal plane for the electron rays passed through the monochromator 100. In consequence, the virtual electron source becomes circular in shape.

Positional dispersion means that in a monochromator, electron rays are different in position due to their different energies. Angular dispersion means that in a monochromator, the electron rays form different angles relative to the optical axis due to their different energies.

In the example shown in FIG. 1, both first energy-selecting slit 60 and second energy-selecting slit 62 are used. Alternatively, either only the first energy-selecting slit 60 or only the second energy-selecting slit 62 may be used because the first and second slits 60, 62 are optically equivalent.

1.3. Advantageous Effects

The monochromator 100 includes the first Wien filter 10, the second Wien filter 20, the third Wien filter 30, and the fourth Wien filter 40. The first through fourth Wien filters 10, 20, 30, 40 produce electromagnetic fields which are identical in sense and strength. Therefore, in the monochromator 100, positional dispersion and angular dispersion in the electron rays can be reduced as described previously. As a result, where TEM imaging is done, for example, such that a defocused electron beam is directed at a sample, the energies of the rays of the beam can be made uniform. Furthermore, where STEM imaging is done using an electron beam not focused greatly, electron scattering can be achieved by the use of the electron beam having a uniform energy distribution. This can eliminate the anisotropy of chromatic aberration in HAADF-STEM.

Figure 4:
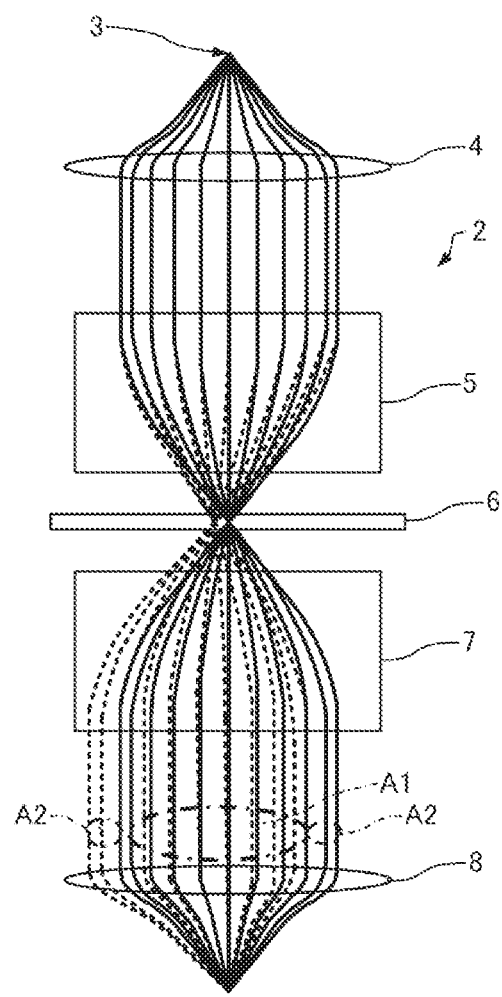
FIG. 4 is an electron ray diagram illustrating the configuration of a monochromator of the double Wien filter type.

In the double Wien filter type monochromator 2 shown in FIG. 4, for example, an electron beam having a uniform energy distribution can be extracted by inserting an aperture stop for limiting the angle of the beam such that electron rays lying in the angular region A1 pass through the aperture stop.

However, where TEM imaging is done in such a way that the electron beam is defocused (i.e., spread in cross section) and that a wide area of a sample is irradiated with the electron beam, if an aperture stop is inserted, the strength of the electron beam impinging on the sample will decrease. In TEM imaging using a monochromator, monochromatization of the electron beam decreases the current dose. Eventually, this will lead to a severe shortage of the strength of the electron beam.

In STEM imaging where an electron beam is focused and scanned over a sample to image a sample, the cross section of the electron beam is demagnified to an atomic scale by the use of condenser lenses. This also results in an increase in the angular magnification of the electron beam. Therefore, the angular dispersion incurred in the monochromator 2 is enlarged. Also, the angular region A1 is enlarged. Consequently, in STEM imaging where the electron beam is converged greatly, it is easy to obtain an electron beam having a uniform energy distribution.

However, where analysis is performed using a technique such as electron energy loss spectroscopy (EELS) or energy dispersive x-ray spectroscopy (EDS), the electron beam may not be converged strongly. In such a case, the angular region A1 shrinks and the electron beam hitting the sample suffers from angular dispersion. As a result, the energy distribution of the electron beam scattered over a wide angle, which is detected by HAADF-STEM, becomes nonuniform. Anisotropy may be induced in the resolution by the effects of chromatic aberration.

In the monochromator 100, the angular distribution in the electron beam can be reduced by the four stages of Wien filters as described above and so the above-described problems do not occur.

In the foregoing description, the monochromator 100 monochromatizes the electron beam. The monochromator 100 may monochromatize a charged particle beam such as an ion beam other than an electron beam.

2. Second Embodiment 2.1. Configuration of Monochromator

Figure 2:
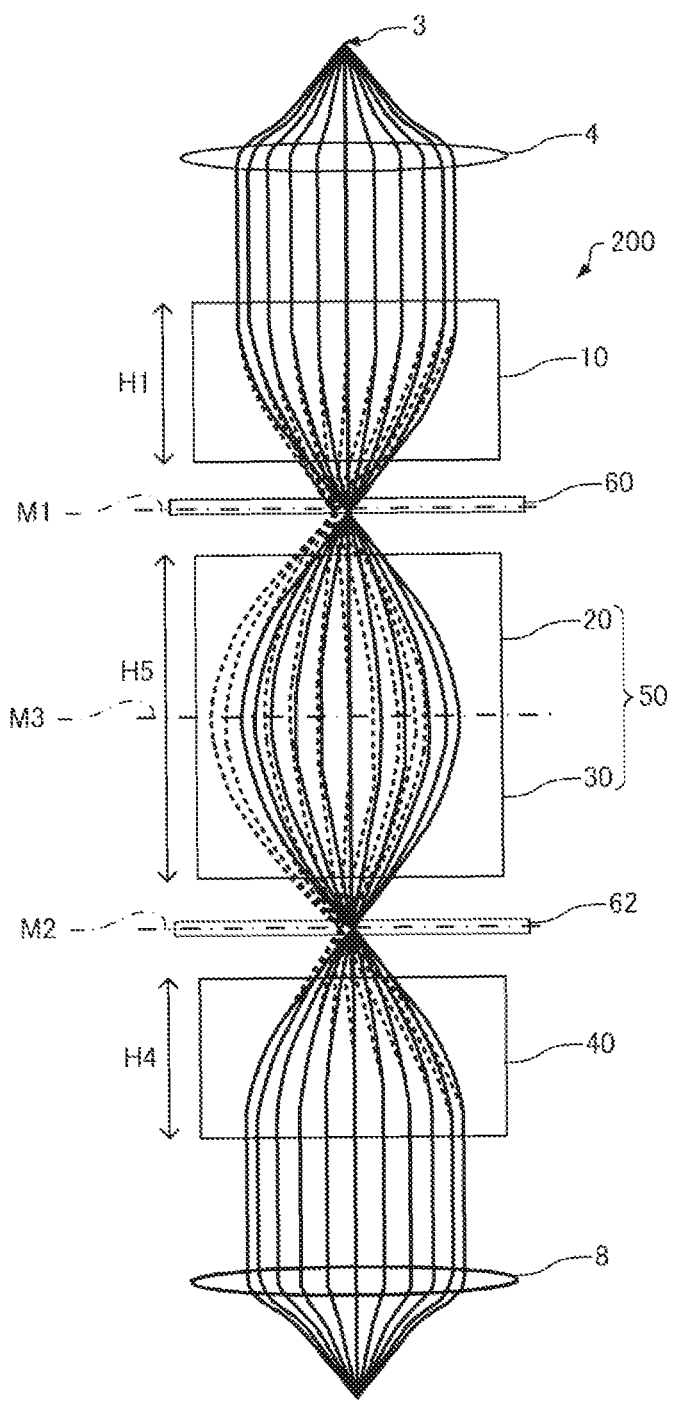
FIG. 2 is an electron ray diagram illustrating the configuration of a monochromator associated with a second embodiment.

A monochromator associated with a second embodiment is next described by referring to FIG. 2, which illustrates the configuration of the monochromator, 200, associated with the second embodiment. Those members of the monochromator 200 which are similar in function with their respective counterparts of the monochromator 100 associated with the first embodiment are indicated by the same reference numerals as in FIG. 1 and a detailed description thereof is omitted.

As shown in FIG. 2, in the monochromator 200, the second Wien filter 20 and the third Wien filter 30 are fabricated integrally as a single fifth Wien filter 50. That is, the monochromator 200 is equipped with three stages of Wien filters. The fifth Wien filter 50 is disposed between the first Wien filter 10 and the fourth Wien filter 40.

The fifth Wien filter 50 has a height H5 which is equal to the sum of the height H2 of the second Wien filter 20 and the height H3 of the third Wien filter 30. That is, the heights H1, H5, and H4 of the first, fifth, and fourth Wien filters 10, 50, and 40, respectively, have the relationship: H1:H5:H4=1:2:1. For example, the length of the fifth Wien filter 50 taken along the optical axis of the electrodes and magnetic pole-pieces is twice the length of the first Wien filter 10 taken along the optical axis of the electrodes and magnetic pole-pieces.

The distance between the first Wien filter 10 and the fifth Wien filter 50 is equal to the distance between the fifth Wien filter 50 and the fourth Wien filter 40.

The distance between the first Wien filter 10 and the first energy-selecting slit 60 is equal to the distance between the first energy-selecting slit 60 and the fifth Wien filter 50. The distance between the fifth Wien filter 50 and the second energy-selecting slit 62 is equal to the distance between the second energy-selecting slit 62 and the fourth Wien filter 40.

In the monochromator 200, the second Wien filter 20 and the third Wien filter 30 are fabricated integrally. Therefore, the third plane of symmetry M3 is located at the center of the fifth Wien filter 50 as taken along the optical axis.

2.2. Operation of Monochromator

The operation of the monochromator 200 is next described by referring to the electron ray diagram of FIG. 2.

In the monochromator 200, the first, fifth, and fourth Wien filters 10, 50, and 40 are so operated that the first, second, third, and fourth Wien filters 10, 20, 30, 40 produce the same electromagnetic field.

Electron rays emitted from the electron source 3 are collimated by the first electrostatic lens 4 and spectrally dispersed by the first Wien filter 10. As a result, a spectrum corresponding to the velocity distribution among the electron rays is created on the first energy-selecting slit 60. The electron rays which are uniform in velocity are passed through the first energy-selecting slit 60. Consequently, the electron rays are monochromatized. The electron rays passed through the first energy-selecting slit 60 have a finite energy width corresponding to the width of the slit 60.

The electron rays passed through the first energy-selecting slit 60 are spectrally dispersed by the fifth Wien filter 50. As a result, a spectrum corresponding to the distribution of velocity of the electron rays is created on the second energy-selecting slit 62. The electron rays passed through this slit 62 enter the fourth Wien filter 40.

In the fourth Wien filter 40, the electron rays are collimated, and positional dispersion and angular dispersion are canceled out. As shown in FIG. 2, the trajectories of electron rays having different energies coincide in the fourth Wien filter 40, thus canceling positional dispersion and angular dispersion.

The electron rays passed through the fourth Wien filter 40 are converged into one point by the second electrostatic lens 8. In the monochromator 200, positional dispersion and angular dispersion of the electron rays are canceled out and so energy dispersion is canceled out at and around the focal plane for the electron rays passed through the monochromator 200. As a result, the virtual electron source assumes a circular form.

2.3. Advantageous Effects

In the monochromator 200, the second Wien filter 20 and the third Wien filter 30 are fabricated integrally. The monochromator 200 can yield advantageous effects similar to those produced by the above-described monochromator 100.

3. Third Embodiment

Figure 3:
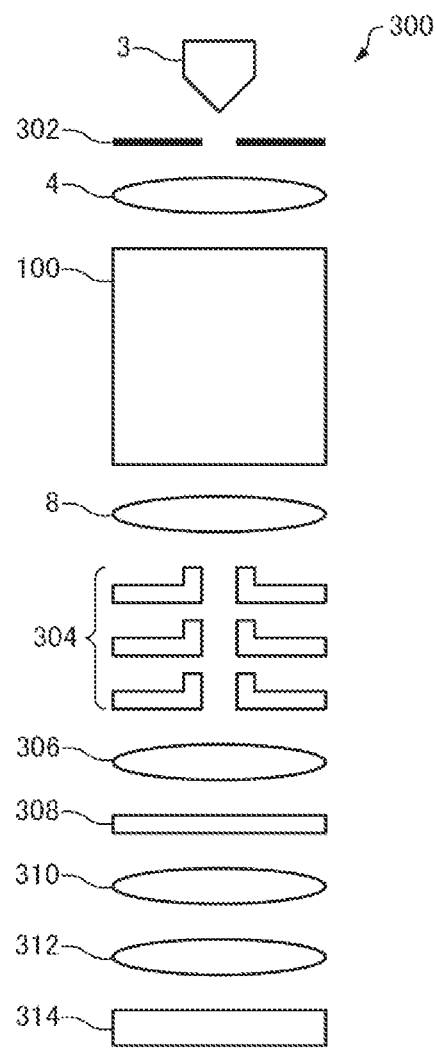
FIG. 3 is a schematic view illustrating the configuration of an electron microscope associated with a third embodiment.

An electron microscope associated with a third embodiment is next described by referring to FIG. 3, which illustrates the configuration of the electron microscope, 300, associated with the third embodiment.

The electron microscope 300 is equipped with the monochromator 100 for monochromatizing electron rays directed at a sample. Alternatively, the electron microscope 300 may be equipped with the monochromator 200 in a manner not illustrated.

As shown in FIG. 3, the electron microscope 300 includes the electron source 3, an aperture stop 302, the first electrostatic lens 4, the second electrostatic lens 8, an accelerator tube 304, an illumination lens system 306, a sample stage 308, an objective lens 310, a projector lens system 312, a detector 314, as well as the monochromator 100.

The electron source 3 emits electron rays, for example, by accelerating electrons, which are released from a cathode, by means of an anode. The electron source 3 is a well-known electron gun, for example.

The first electrostatic lens 4 is mounted ahead of (i.e., upstream of) the monochromator 100 and operates to adjust the trajectories of the electron rays ejected from the electron source 3, i.e., the angles of incidence of the electron rays relative to the monochromator 100.

The monochromator 100 is incorporated in the illumination system of the electron microscope 300. The electron rays are monochromatized by the monochromator 100.

The second electrostatic lens 8 is mounted behind the monochromator 100 and operates to adjust the trajectories of the electron rays impinging on the sample.

The electron rays monochromatized by the monochromator 100 are accelerated by the accelerator tube 304 and directed at a sample held on the sample stage 308 through the illumination lens system 306. The illumination lens system 306 is made up of a plurality of condenser lenses.

The electron rays transmitted through the sample are brought to a focus by the objective lens 310. The focused electron rays are then magnified by the projector lens system 312 and focused onto the detector 314. A TEM image focused by the projector lens system 312 is detected by the detector 314.

In the example shown in FIG. 3, the monochromator 100 is placed ahead of (i.e., upstream of) the accelerator tube 304. Alternatively, the monochromator 100 may be placed behind the accelerator tube 304.

In the foregoing description, the electron microscope 300 being a transmission electron microscope (TEM) is set forth as a charged particle beam system including the monochromator 100. The charged particle beam system including the monochromator 100 is not restricted to a transmission electron microscope. Examples of the charged particle beam system including the monochromator 100 include, for example, a scanning transmission electron microscope (STEM), a scanning electron microscope (SEM), and a focused ion beam (FIB) system.

It is to be understood that the present invention is not restricted to the above-described embodiments but rather can be modified variously. For example, the present invention embraces configurations substantially identical (e.g., in function, method, and results or in purpose and advantageous effects) with the configurations described in any one of the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques are added.

What is claimed is:

1. A monochromator comprising:
   a first Wien filter;
   a second Wien filter placed behind the first Wien filter;
   a third Wien filter placed behind the second Wien filter;
   a fourth Wien filter placed behind the third Wien filter; and
   at least one energy-selecting slit placed in at least one of
      a space between the first and second Wien filters and a space between the third and fourth Wien filters;

wherein the first and second Wien filters are arranged symmetrically with respect to a first plane of symmetry;

wherein the third and fourth Wien filters are arranged symmetrically with respect to a second plane of symmetry;

wherein a pair of said first and second Wien filters and a pair of said third and fourth Wien filters are arranged symmetrically with respect to a third plane of symmetry; and wherein the first, second, third, and fourth Wien filters produce their respective electromagnetic fields which are identical in sense and strength.

2. The monochromator as set forth in claim 1, wherein said at least one energy-selecting slit is two in number, and wherein one of these two energy-selecting slits is placed in said first plane of symmetry while the other is placed in said second plane of symmetry.

3. The monochromator as set forth in claim 1, wherein said second Wien filter and said third Wien filter are fabricated integrally.

4. A charged particle beam system including a monochromator as set forth in claim 1.

* * * * *